United States Patent [19]
Bhatt et al.

[11] Patent Number: 5,599,747
[45] Date of Patent: Feb. 4, 1997

[54] METHOD OF MAKING CIRCUITIZED SUBSTRATE

[75] Inventors: Ashwinkumar C. Bhatt; Thomas P. Duffy, both of Endicott; David E. Houser; Gerald W. Jones, both of Apalachin; Jeffrey McKeveny, Endicott; Kenneth L. Potter, Kirkwood, all of N.Y.

[73] Assignee: International Business Machines Corporation, Armonk, N.Y.

[21] Appl. No.: 495,248

[22] Filed: Jun. 27, 1995

Related U.S. Application Data

[63] Continuation-in-part of Ser. No. 390,344, Feb. 15, 1995.

[51] Int. Cl.⁶ .................................................. H01L 21/60
[52] U.S. Cl. .......................... 437/209; 437/211; 437/214; 437/217; 437/219
[58] Field of Search .................................. 437/209, 211, 437/212, 213, 214, 215, 216, 217, 218, 219, 220

[56] References Cited

U.S. PATENT DOCUMENTS

| | | | |
|---|---|---|---|
| 4,773,955 | 9/1988 | Mabuchi et al. | 156/257 |
| 5,048,179 | 9/1991 | Shindo et al. | 437/209 |
| 5,102,829 | 4/1992 | Cohn | 437/217 |
| 5,175,060 | 12/1992 | Enomoto et al. | 437/220 |
| 5,285,352 | 2/1994 | Pastore et al. | 257/712 |
| 5,397,917 | 3/1995 | Ommen et al. | 257/698 |

*Primary Examiner*—Kevin Picardat
*Attorney, Agent, or Firm*—Lawrence R. Fraley

[57] ABSTRACT

A method of making a circuitized substrate which may be utilized as a chip carrier structure. The method involves the steps of providing a dielectric member and partially routing this member to define a temporary support portion therein. Metallization and circuitization may then occur, following which the temporary support portion is removed. This temporary support thus assures effective support for the photoresist used as part of the circuitization process. Thus, the photoresist is capable of being applied in sheetlike form for spanning the relatively small openings of the dielectric without sagging, bowing, etc., which may adversely impact subsequent processing steps.

15 Claims, 5 Drawing Sheets

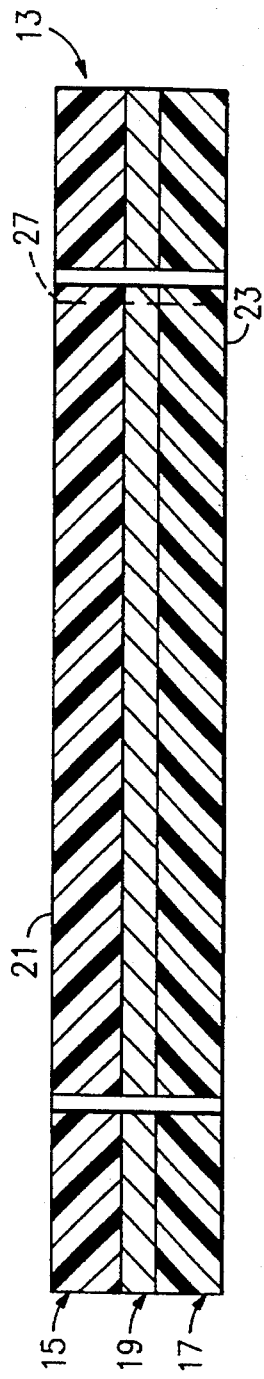
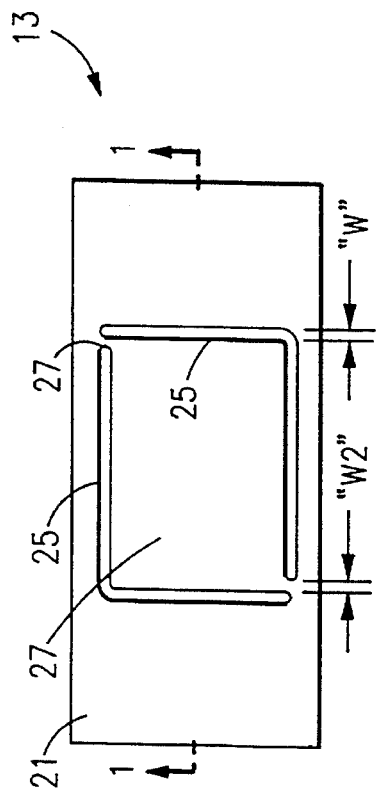
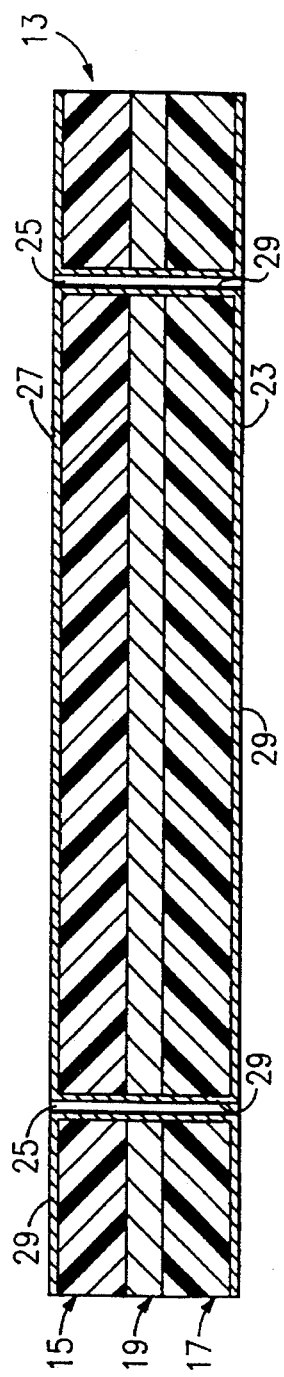
FIG.1
FIG.2
FIG.3

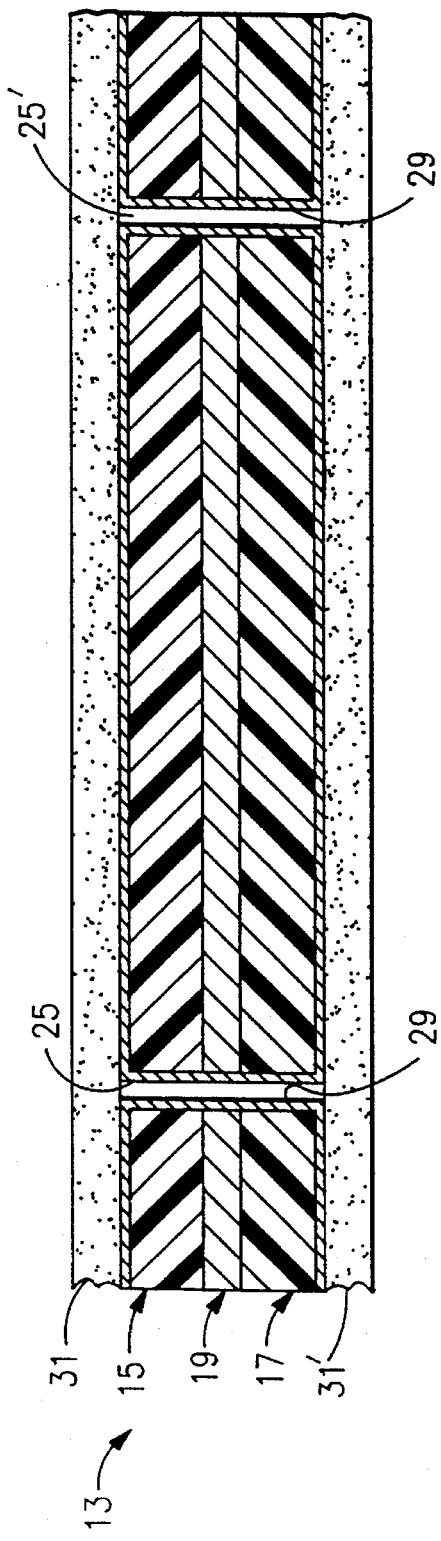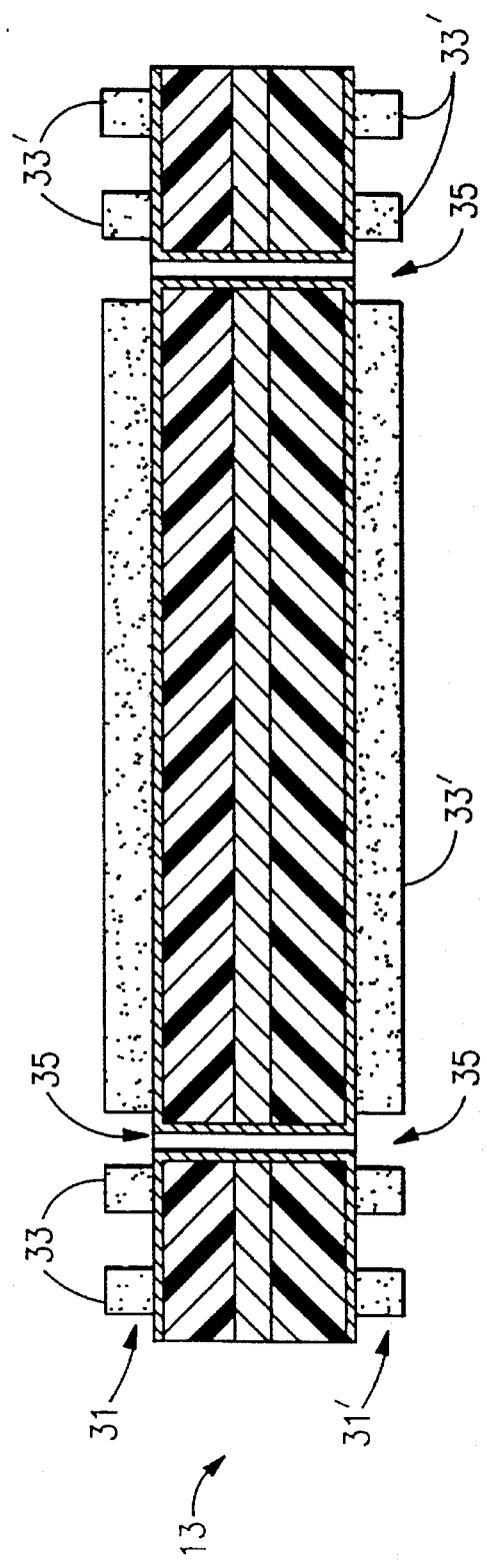

METHOD OF MAKING CIRCUITIZED SUBSTRATE

This is a Continuation-In-Part application of Ser. No. 08/390,344, filed Feb. 15, 1995. Ser. No.08/390,344 is also mentioned below.

TECHNICAL FIELD

The invention pertains generally to circuitized substrates and particularly to chip carriers for integrated circuits (semiconductor chips).

CROSS REFERENCE TO COPENDING APPLICATIONS

In Ser. No. 08/359,491, entitled "Method Of Laminating And Circuitizing Substrates Having Openings Therein", filed Dec. 20, 1994, there is defined a method of laminating two substrates and circuitizing at least one of these. A plug is provided and shaped to fit within an opening defined in the structure, and then removed following lamination and circuitization.

In Ser. No. 08/390,344, entitled "Organic Chip Carriers For Wire Bond-Type Chips", filed Feb. 15, 1995, there is defined a chip carrier having a single-tiered cavity within a dual layered (of organic material) substrate and a semiconductor chip located in the cavity. The chip is wire bonded to circuitry on the substrate. The method claimed in the present Application may be used to make a chip carrier of the type defined in Ser. No. 08/390,344.

In Ser. No. 08/470,389, entitled "Method Of Construction Of Multi-Tiered Cavities Used In Laminate Carriers", filed Jun. 16, 1995 under Attorney's Docket Number EN995015, there is defined a method of forming a chip module wherein a rigid cap and substrate are used, the cap and substrate laminated together with bond pads connected to circuitry disposed in a bottomed cavity of the cap. Following cap circuitization, part of the cap (that over the cavity) is removed and a semiconductor chip coupled to the circuitry.

All of the above Applications are assigned to the same assignee as the present invention. The teachings of these Applications are hereby incorporated herein by reference.

BACKGROUND OF THE INVENTION

Integrated circuit devices (hereinafter referred to as semiconductor chips) are typically electronically packaged by mounting one or more chips onto a ceramic, e.g., alumina, circuitized substrate (referred to as a chip carrier) and using wire bonds to electrically connect I/O (input/output) contact pads on each chip to corresponding contact pads (and therefore to corresponding fan-out circuitry) on the circuitized chip carrier substrate. Wire bonding is a well known process in the art and further description is not believed necessary. The resulting chip carrier is then typically mounted on a printed circuit board (PCB) and, using circuitry on the PCB, electrically coupled to other such chip carriers and/or other electronic components mounted on the PCB.

While ceramic chip carrier structures have proven extremely useful in the electronic packaging field, the use of ceramic as the dielectric material of the substrate does present certain limitations and drawbacks. For example, the speed of propagation of an electrical signal through a conductive wire located on a dielectric layer (or between two dielectric layers for that matter) is proportional to the inverse of the square root of the dielectric constant of the dielectric material layer or layers. As is known, the dielectric constants of most ceramics are relatively large, e.g., the dielectric constant of alumina (the primary constituent of ceramic materials used in these substrates) is relatively high, which results in ceramic chip carriers exhibiting relatively low signal propagation speeds in comparison to substrates of other (e.g., organic) materials, such as fiberglass-reinforced epoxy resin, polytetrafluorethylene, etc.

Utilization of ceramic chip carrier substrates also presents certain I/O constraints. For example, a single-layer ceramic chip carrier substrate includes but a single layer of fan-out circuitry on the upper surface of the ceramic substrate, extending to contact pads around the outer periphery of the substrate. A lead frame, having inner leads connected to these peripheral contact pads, is typically used to electrically connect such a ceramic chip carrier to a PCB. As the number of chip I/Os has increased (in response to more recent enhanced design requirements), it is has been necessary to increase the wiring density, sometimes to the point where undesirable cross-talk between adjacent wires may occur. Further, it has become increasingly difficult, if not impossible, to form a correspondingly large number of contact pads around the outer periphery of the ceramic substrate. Accordingly, it is understood that single-layer ceramic chip carrier substrates are limited in the ability thereof to accommodate semiconductor chips with significantly increased I/O counts as demanded in many of today's designs.

Various efforts to accommodate chips having relatively large numbers of I/O pads have led to the use of multilayer ceramic chip carrier substrates utilizing what are referred to as "ball grid arrays" (BGAs) in lieu of lead frames. Such multilayer types of ceramic chip carrier substrates differ from single-layer ceramic chip carrier substrates in that these include two or more layers of fan-out circuitry on two or more ceramic layers. Significantly, these layers of fan-out circuitry are electrically interconnected by mechanically drilled holes (called "vias"), which are plated and/or filled with electrically conductive material (e.g., copper). In addition, a certain number of such holes extend from the layers of fan-out circuitry to respective lands on the chip carrier substrates, on which are mounted solder balls (formed in grid arrays, hence the term "ball grid array"). These solder balls are intended to be mechanically and electrically connected to corresponding solderable contact pads on a receiving substrate, e.g., PCB. Unfortunately, the mechanically drilled holes electrically interconnecting the layers of fan-out circuitry have relatively large diameters, requiring the spacing between the fan-out wires to be relatively large. This relatively large spacing between fan-out wires understandably limits the number of chip I/O pads which can be accommodated by such multilayered substrates.

Other attempts to package chips having a relatively large number of chip I/O pads have led to the use of multi-tiered cavities in multi-layered ceramic substrates. (As used herein, the term "cavity" denotes a depression in a substrate, not a hole or opening extending entirely through the substrate's thickness.) When using such a packaging configuration, a chip is mounted face-up (its I/O pads facing upwardly) at the bottom of a multi-tiered cavity. Wire bonds (e.g., using fine gold wire) are extended from the I/O contact pads on the exposed upper surface of the chip to respective contact pads on the exposed upper surfaces of the different layers of the multi-layered ceramic substrate. While this configuration does make it possible to accommodate a relatively large number of chip I/O pads, it unfortunately typically mandates usage of multiple manufacturing set-up operations to accommodate the different tier height for the relatively long wire bonds extending from the chip to the tiers of the multi-tiered cavity.

Ceramic chip carrier substrates are also limited in heat dissipation capabilities. For example, in the case of a multilayer ceramic chip carrier having a chip positioned at the bottom of a multi-tiered cavity, heat dissipation is typically achieved by providing a heat sink directly beneath the cavity. This implies, however, that the heat generated by the chip must necessarily be conducted through the ceramic layer at the bottom of the cavity before reaching the heat sink. As a consequence, the rate of heat dissipation is limited.

As defined herein, the present invention teaches a method for making a circuitized substrate capable of overcoming the aforementioned drawbacks of other such products. This method is uniquely adaptable for use with many existing manufacturing apparatus (e.g., wire bond and photoimaging equipment) without extensive alteration thereof and can thus be used on a mass production basis to enjoy the benefits thereof.

Various methods for making circuitized substrates are described in U.S. Pat. No. 5,022,960 (Takeyama et al), U.S. Pat. No. 5,142,448 (Kober et al), U.S. Pat. No. 5,144,534 (Kober) and U.S. Pat. No. 5,288,542 (Cibulsky et al). In U.S. Pat. No. 5,022,960, a laser beam is used to remove a selected portion of a substrate (12) which eventually accommodates a semiconductor chip (20) positioned on a metal layer (11) also attached to the substrate. In U.S. Pat. No. 5,142,448 there is described the step of compression molding several dielectric layers to form a laminate. Flexibility of certain parts of the board is attained by provision of slots, and a "plug" is located for occupying the defined flexible region. In U.S. Pat. No. 5,144,534, a method of making rigid-flexible circuit boards is described in which a removable plug is used in the PCB during processing and then removed. Finally, in U.S. Pat. No. 5,288,542 (assigned to the same assignee as the present Application), another method is described for making a rigid-flexible circuit board in which a release layer (6) is used during processing and subsequently removed.

None of the above patents overcome many of the aforementioned difficulties regarding known processes while assuring the higher densities mandated in today's technology.

Accordingly, it is believed that a method of making a circuitized substrate which overcomes the above disadvantages and which can be performed in a facile and relatively inexpensive manner would represent a significant advancement in the art.

As defined herein, such a method will result in a circuitized substrate capable of: (1) exhibiting relatively high electrical signal propagation speeds; (2) accommodating relatively high I/O chips; (3) exhibiting relatively short "time of flight" electrical signal speeds; and (4) exhibiting a relatively high rate of heat dissipation.

DISCLOSURE OF THE INVENTION

It is, therefore, an object of this invention to provide a method of making a circuitized substrate capable of being used as a chip carrier assembly which can be performed in a facile and relatively inexpensive manner in comparison to existing carrier manufacturing processes.

It is a more particular object of the invention to provide such a process which is readily adaptable to existing manufacturing equipment without extensive modification thereof.

In accordance with one aspect of this invention, there is defined a method of making a circuitized substrate, the method comprising the steps of providing an electrically insulative base member having first and second opposing surfaces, removing preselected portions of the base member to form at least one slot extending substantially entirely through the base member and defining a temporary support portion within the insulative base member. The method as defined further includes applying photoimaging material onto the first opposing surface of the base member, including over the temporary support portion and the removed selected portions of the base member, exposing and developing selected portions of the photoimaging material to define a predetermined pattern within the photoimaging material, circuitizing the first surface of the base member, and removing additional portions of the base member to thereby remove the temporary support portion and define an opening extending through the base member. This opening may serve to accomodate a semiconductor chip which is electrically coupled to the formed circuitry.

BRIEF DESCRIPTION OF THE DRAWINGS

FIGS. 1–8 represent the various steps of making a circuitized substrate in accordance with a preferred embodiment of the invention.

BEST MODE FOR CARRYING OUT THE INVENTION

Figure 6:
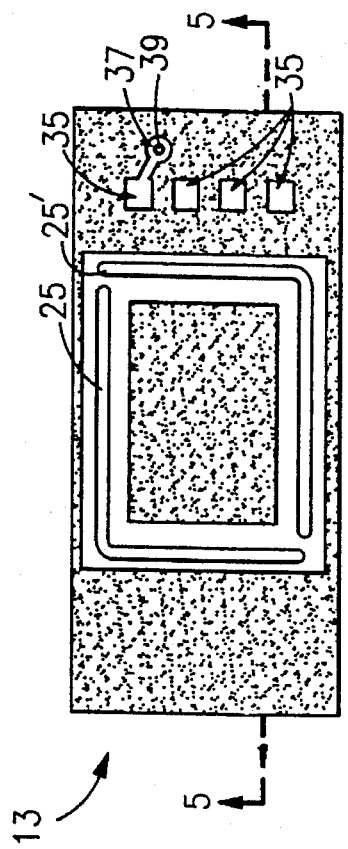

For a better understanding of the present invention, together with other and further objects, advantages and capabilities thereof, reference is made to the following disclosure and appended claims in connection with the above-described drawings.

The invention defines a method of making a circuitized substrate (and the resulting chip carrier) in which the chip carrier is particularly designed to accommodate wire bond-type chips. The carrier produced in accordance with the teachings herein is capable of: (1) exhibiting relatively high electrical signal propagation speeds; (2) accommodating relatively high I/O chips; (3) avoiding the need for multiple manufacturing set-up operations heretofore associated with multi-tiered wire bond packages (as well as achieving a relatively short "time of flight" for electrical signals propagating through the wire bonds); and (4) assuring a relatively high rate of heat dissipation. In particular, the chip carrier produced in accordance with the preferred method taught herein achieves relatively high electrical propagation speeds because it employs organic materials, such as fiberglass-reinforced epoxy resins (in the trade also referred to as "FR4"), polytetrafluorethylene (e.g., Teflon), etc. in lieu of ceramic materials. (Teflon is a trademark of E. I. dupont deNemours.) The resulting chip carrier also accommodates relatively high I/O count chips because it uses at least one organic photoimageable dielectric layer in which photo-vias may be formed to electrically interconnect two (or more) layers of fan-out circuitry. The resulting chip carrier achieves a relatively short "time of flight" for electrical signals propagating through the wire bonds. The invention may further provide enhanced heat sinking for such a structure through the attachment of a sound heat conductor (e.g., copper sheet) to one side of the substrate and placement of the chip (or chips) in thermal contact therewith.

In FIG. 1, there is shown an electrically insulative base member 13 which may be used in the present invention to produce a chip carrier product (described below). It is understood that the invention is not limited to the particular configuration shown in FIG. 1, as others are readily possible. Base member 13 includes first and second dielectric layers 15 and 17 which sandwich therebetween a conductive layer 19. In a preferred embodiment, each of the two dielectric layers is comprised of fiberglass reinforced epoxy resin (FR4) and each possess a thickness of from about 2 mils (thousandths) to about 20 mils. Thicknesses less than about 2 mils for this particular material may be undesirable because the resulting structure may be flimsy and difficult to handle during subsequent manufacturing processes. Thicknesses greater than about 20 mils may be undesirable because such thick dielectric layers, in addition to requiring relatively large conductor line widths and thicknesses, also may prevent optimum package electrical performance.

Sandwiched between dielectric layers 15 and 17 is a conductive layer 19, preferably of copper or other well-known conductive material and possessing a thickness of preferably within the range of about 0.125 mils to about 2.5 mils. The thicknesses for layer 19 of less than 0.125 mils may prove undesirable should the resulting structure be subjected to relatively high temperatures. Additionally, thicknesses greater than 2.5 mils may prove undesirable because of the additional time necessary to form such layers using conventional plating techniques and associated difficulties with line width control.

The resulting structure shown in FIG. 1 thus preferably possesses a thickness within the range of about 4.125 mils to about 42.5 mils. More preferably, a thickness of about 24 mils is used.

Dielectric layers 15 and 17 are bonded to the conductive layer 19 using a lamination process, such a process known in the art and further description is not believed necessary.

Base member 13 is thus shown to include at least two opposing surfaces 21 and 23.

Although two dielectric layers are shown for base member 13, it is understood that the invention is not limited thereto. Specifically, it is only necessary to provide one such layer while still attaining the advantageous results taught herein. At least two layers are used when it is desired to incorporate an internal conductive plane (e.g., power, ground or signal) as part of the final structure. Understandably, several dielectric layers and corresponding internal conductive layers may be utilized, depending on operational requirements for the finished product.

In FIG. 2 (a plan view of the base member 13 of FIG. 1), a pair of L-shaped slots 25 and 25' are formed within member 13. As understood, these slots serve to substantially define the ultimate boundaries of an opening (described below) to be provided in member 13 such that the member can accommodate a semiconductor chip positioned within this opening and electrically coupled to circuitry (described below) of member 13. As seen in FIG. 2, these slots 25 and 25' define a substantially rectangular (e.g., preferably square) portion 27 within base member 13, which hereinafter will be referred to as a temporary support portion.

Although a substantially rectangular shape is shown for temporary support portion 27 in the plan view of FIG. 2, other shapes are readily possible, depending on the ultimate chip configuration and the method of coupling this chip to base member 13. In one example, the resulting opening (51, FIGS. 8 and 9) of this support portion possessed (when removed) width and length dimensions each within the range of about 500 to about 700 mils, with each of the slots 25 and 25' possessing an average width ("W" in FIG. 2) of about 60 mils.

In the broader aspects of the invention, it is possible to provide only a singular slot within member 15 (e.g., to define a substantially cylindrical support portion) thereby allowing only one non-removed segment (e.g., 27').

The preferred means for providing slots 25 and 25' is to use a routing process using equipment known in the art, further description thus not believed necessary. In one embodiment, the non-removed parts 27' each possessed a width ("W2" in FIG. 2) of only about 40 mils.

In the next step (FIG. 3 ), it is preferred to provide a seed layer on the surfaces 21 and 23 of base member 13, and also on the internal surfaces of individual slots 25 and 25'. As seen in FIG. 3, this seed layer material extends through the entire thickness of member 13. The preferred material for the seed layers 29 is palladium-tin. Understandably, the described seed layer serves to enhance subsequent positioning of the invention's conductive circuitry (described below).

As mentioned above, a key attribute of the present invention is its adaptability to many existing technologies, e.g., those used in mass production, by allowing the invention as defined herein to benefit from the several advantages thereof. One particular process involves what is referred to as a dry film resist operation in which the photoresists used are applied in film form. Typically, such films are removed from supply rollers and aligned with respective surfaces of the substrate being treated. Such a process has become widely accepted in the field, and further description is not believed necessary.

In FIG. 4, two layers 31 and 31' of photoimaging (photoresist) material are shown as being positioned on the respective surfaces of member 13. In one example, each layer of photoresist possessed a thickness of from about 0.6 mils to about 2.0 mils. A preferred material is a negative-acting photoresist, various examples being known in the art, including Photoresist 3120 and Photoresist T168, both available from the E. I. duPont deNemours Corporation under these trade designations. Negative-acting photoresists, when applied and exposed through a suitable photomask, undergo a physical and chemical change in the exposed areas that render these areas insoluble to the subsequent developing solution which is to be applied thereto. Following exposure, the resist-coated base member 13 is immersed in this developing solution (e.g., sodium carbonate, propylene carbonate), which allows the unexposed areas to be removed without excessive impact on the hardened, exposed area. Baking or other processes may be used to further harden the remaining, exposed portions, if desired.

In FIG. 5, base member 13 is shown following the above exposure and removal (developing) operations. As such, only portions of each photoresist layer 31 and 31' remain. These portions are represented by the numerals 33 (those on the upper surface) and 33' (those on the lower surface). It is understood that the removed portions of the photoresist in turn result in openings (35) which, in turn, expose preselected areas on the respective surfaces on which circuitization is to eventually occur. Thus a predetermined pattern on both surfaces is provided.

Significantly, prior to the above developing and removal of photoresist, the photoresist was capable of being applied across the entire surfaces of member 13, including, significantly, over the 60 mil wide slots 25 and 25'. These film (sheetlike) layers of photoresist are able to bridge the L-shaped slots 25 and 25' without bowing or otherwise extending within the slots. Heretofore, when larger openings (e.g., 500 mils×500 mils) were provided in the base member 13, such dry film photoresists were incapable of spanning ("tenting") the relatively large widths of such openings. The undesirable result was a sagging or similar disfiguration of the photoresist, rendering subsequent processing extremely difficult and often impossible. Further, the use of such a large spanning photoresist layer resulted in what may be described as "doubling over" of the resist when subjected to the subsequent developing operations in which various relatively high spray pressures of the developer are used, spraying being the preferred technique for providing such developer. As a result, inadequate development processes resulted with photoresist residues occasionally remaining on the parts to in turn result in unacceptable yield rates. Previous attempts to minimize this problem through the adjustment of the exposure pattern for the photoresist or to reduce these pressures in the development step proved unsuccessful in providing consistent improvement. Photoresist layers 31 and 31' are shown as easily bridging (spanning) the respective slots 25 and 25' in FIG. 4.

Although a negative-acting photoresist procedure has been described, the invention is not limited thereto. It is also possible to instead use positive-acting photoresists in which the exposed areas thereof under the photomask, when immersed in the developing solution, are removed. Such photoresists may also be applied in film (sheetlike) form, as are negative-acting photoresists. It is thus seen that the present invention is adaptable to more than one accepted technology.

FIG. 6 illustrates a plan view of the base member of FIG. 5, FIG. 5 being taken along the lines 5—5 in FIG. 6. The respective exposed areas 35 are clearly seen in FIG. 6. In one example, the exposed areas 35 shown to the right in FIG. 6 serve to expose contact pad areas (see below) for use in the final product. Significantly, the areas immediately above the respective slots 25 and 25' are also developed away to thereby expose these slots. (The other exposed areas 35 on the base member 13 are not shown in FIG. 6 for ease of explanation.)

In addition to the exposed pad sites 35 and the slot locations 25 and 25', it is also possible to expose one/more areas on member 13, depending on the operational requirements for the final product. In FIG. 6, one example of such an area is shown and represented by the numeral 37. This area is designed to expose a land segment which in turn surrounds a through-hole 39 (not shown in FIGS. 1–5) which, when rendered conductive (e.g., plated), may serve to interconnect upper and lower layers of circuitry and also internal conductive planes (e.g., 19), if desired.

It is understood that the exposed areas illustrated in FIG. 6 are shown for illustration purposes only and do not limit the invention to those as shown. Specifically, in one example of the invention, a total of about 370 pad sites 35 were provided, in addition to about 350 through-hole sites 37 (all of these, of course, in addition to the exposed area above slots 25 and 25').

Figure 7:
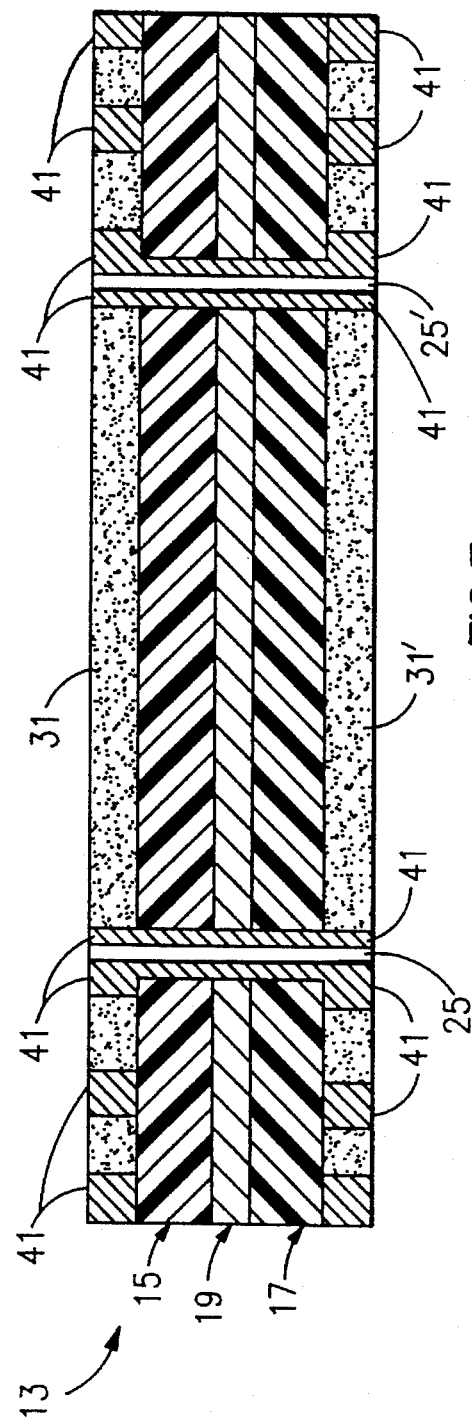

In FIG. 7, member 13 has been subjected to a metallization process in which copper or similarly conductive metal 41 is deposited in the exposed portions (e.g., sites 35 and 37) remaining following photoresist development. In a preferred embodiment, this metallization (which will form the circuitry for member 13) is deposited using a plating process, and preferably an additive plating process. Additive plating is well known in the art and further description is not believed necessary. This process is also referred to in the art as a wet copper plating process. Other plating and/or photolithographic techniques may of course be utilized in place of those mentioned above. For example, positive acting photoresists (as mentioned above) and negative acting photoresists used in conventional subtractive circuitization processes may be used. It is understood that either electroplating or electroless plating may be used to form the circuitry in accordance with the teachings of the present invention. In one embodiment, the deposited copper on the upper and lower surfaces of member 13 possessed a thickness of from about 0.5 mils to about 2.0 mils, the plated copper within the elongated slots 25 and 25' being substantially the same thickness. The aforementioned palladium-tin seed layer is not shown in FIGS. 7–10 for ease of illustration. It is understood, however, that this layer is present and has remained on the exposed surfaces of member 13 following removal of the developed photoresist.

Figure 8:
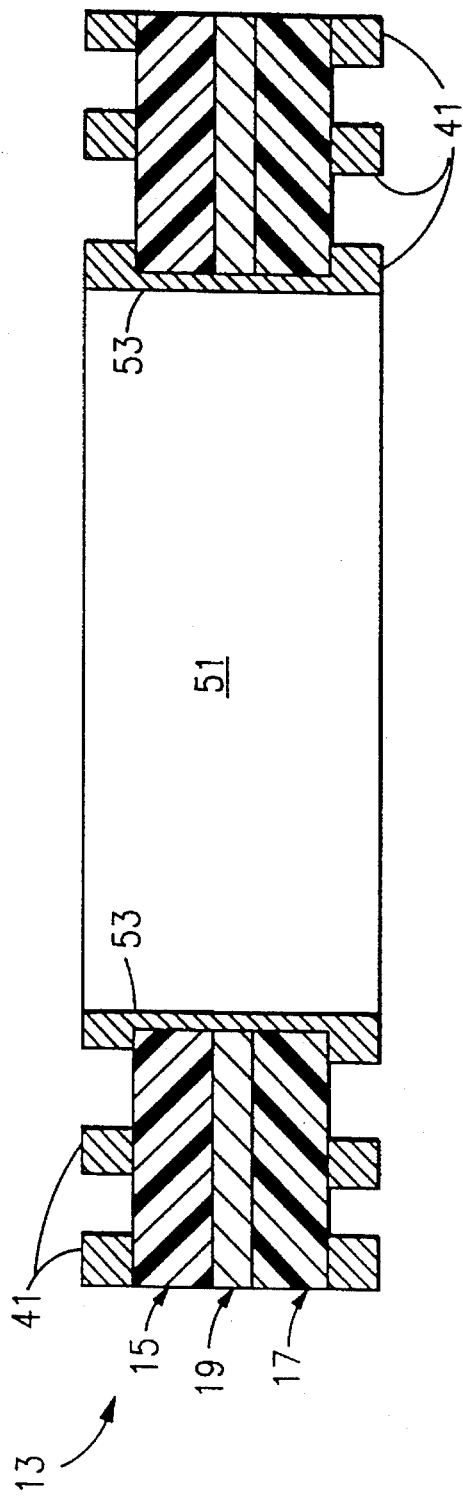

In FIG. 8, the temporary support portion of member 13 has been removed, thereby leaving the illustrated opening 51 therein. This removal process is preferably accomplished using a second routing procedure (and preferably the same routing equipment used to provide initial slots 25 and 25') which simply extends the respective ends of these slots to remove all of the initially non-removed material (27' in FIG. 2). As a result, the temporary support portion is removed, such that opening 51 will include a plurality of plated internal side walls (53 in FIG. 8). Such plating may be desirable to interconnect the opposing conductive layers on both upper and lower surfaces of member 13. If desired, these conductive layers may also be electrically coupled to the internal conductive plane 19, e.g., to thereby provide a ground for selected portions of the respective circuit layers assuming conductive layer 19 functions in this capacity.

At this point, it may also be desirable to selectively apply precious metal (e.g., gold) material to various parts of the respective circuit layers formed on the upper and lower surfaces of member 13. Such application is preferably performed by a plating process, several types of which are known in the art. Further description is not believed necessary. Such additional plating is particularly desired for those surfaces of the circuitry designed to receive the highly conductive, fine wires which will eventually couple a semiconductor chip (described below) to this circuitry.

Figure 9:
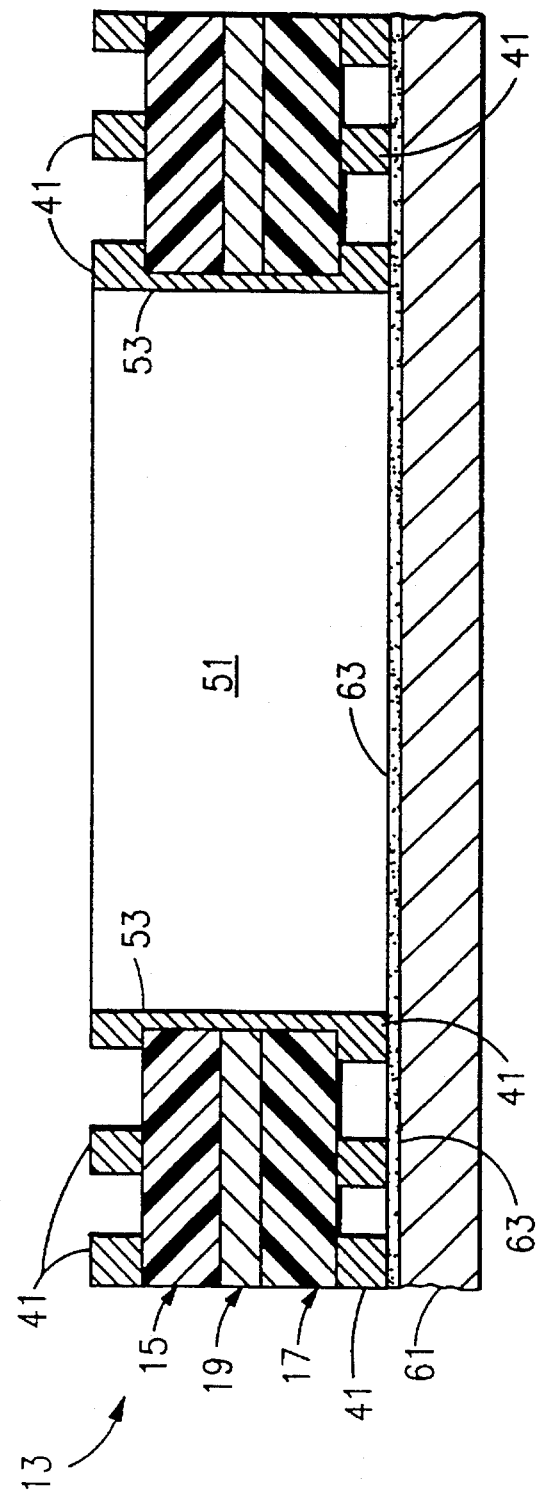
FIGS. 9 and 10 represent additional steps to provide a chip carrier assembly in accordance with a preferred embodiment of the invention.

In the event that it is desired to provide a heat sinking and/or stiffening member, such a member, represented by the numeral 61 in FIG. 9, may be simply bonded to the bottom surface (including the respective conductors 41 if present) of member 13. In one embodiment, this member 61 was comprised of a 14 mil thick copper sheet which was secured to member 13 using an epoxy-based adhesive. This adhesive is represented by the numeral 63.

(Although a second conductive layer is shown in the embodiments depicted herein, it is understood that, in its broadest aspects, the invention may only provide a singular layer (the upper layer of conductive elements 41). Should this be the situation, the heat sink and/or stiffener 61 would be directly attached to the lower surface of the dielectric layer 17.)

Figure 10:
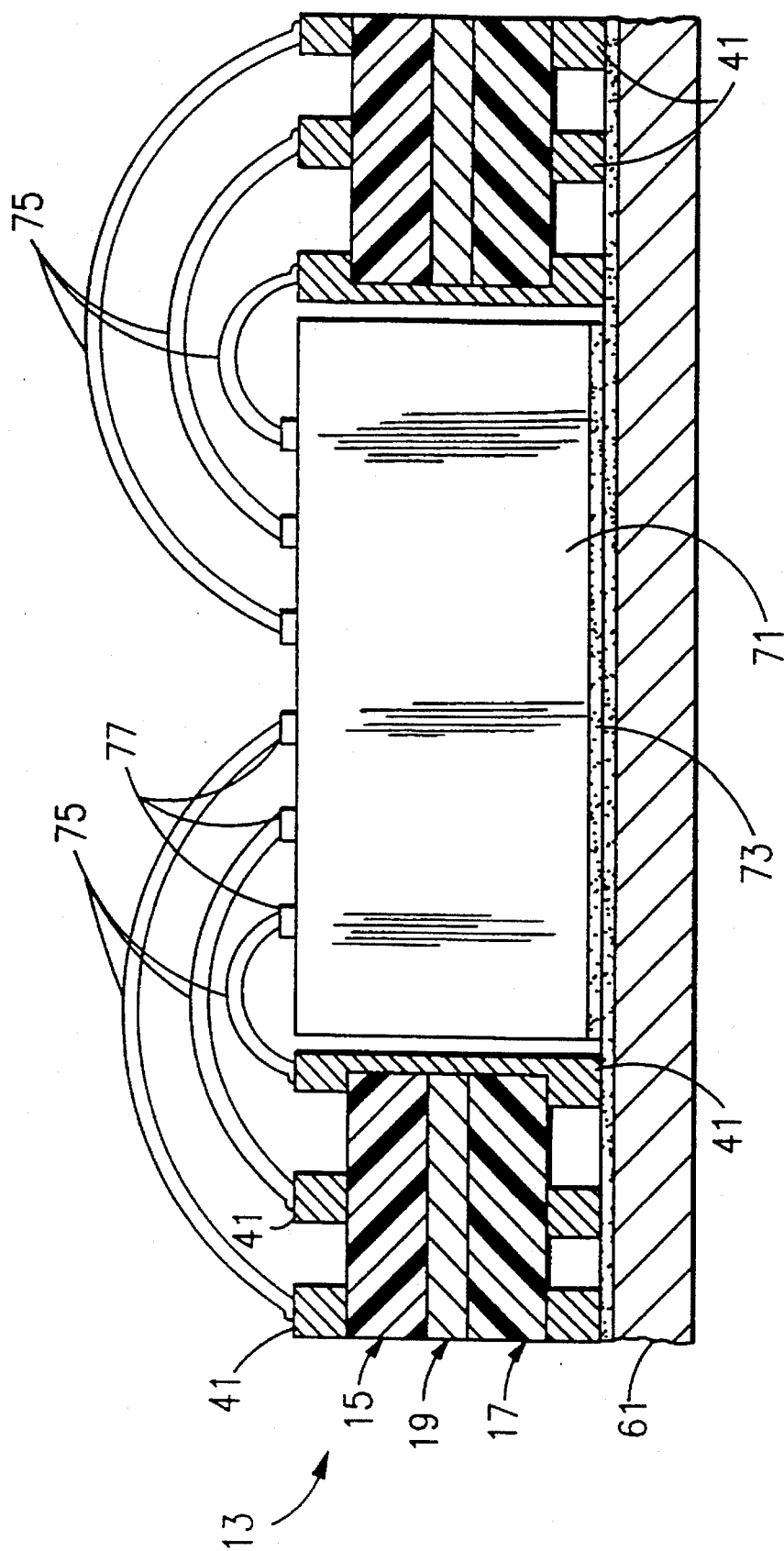

The member 13 in FIG. 9 is now ready to receive an integrated circuit (semiconductor) chip, such as shown in FIG. 10 (the chip represented by the numeral 71). Preferably, chip 71 is bonded to the heat sinking and/or stiffening member 61 using a second adhesive 73, a preferred adhesive being of the thermally conducting type which, in a preferred embodiment, is a commercially available silver-impregnated epoxy sold under the trade designation Ablebond 9651-L by Ablestick Corporation. Chip 71 is thus thermally coupled to member 61 to assure enhanced heat removal from the final package structure as produced in accordance with the teachings herein. Bond wires 75 may now be provided to electrically couple contact sites 77 on the chip's upper surface to corresponding respective ones of the conductive members 41 which form the upper layer of circuitry for member 13. As seen in FIG. 10, these wires extend from the chip outwardly to this circuitry. The wires 75 are preferably provided using a wire bond process, well known in the art.

If desired, an encapsulant material (not shown) may be provided over the wires and associated pads to provide protection from the occasionally harsh environment in which the product produced by the invention is exposed. One suitable encapsulant is an epoxy molding material sold by the Dexter-Hysol Company under the trade name Hysol 4450.

FIG. 10 thus illustrates a chip carrier structure which is now capable of being electrically coupled to additional circuit structures (e.g., printed circuit boards) which form part of the larger information handling system (computer) for which the product produced by the invention is particularly suited. One such form of coupling may include solder ball attach in which solder balls (e.g., 90:10 tin:lead) are used to couple respective parts of member 13's circuitry to the circuitry on one/more of such additional circuit structures. Other techniques are of course readily possible for achieving this end.

Thus there has been shown and described a facile method for producing a circuitized substrate for use as part of a chip carrier assembly which is capable of being readily performed using many established processes of the art. The invention thus represents a relatively inexpensive yet effective process for producing chip carrier structures on a mass scale. While the invention has been described with respect to organic dielectric materials, this is not meant to limit the invention in that even inorganic (e.g., ceramic) may be utilized to provide the dielectric function. As stated above, it is also readily possible to utilize alternative procedures (e.g., subtractive circuitization) which are also known in the art, to accomplish the invention.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising the steps of:

providing an electrically insulative base member having first and second opposing surfaces;

removing preselected portions of said base member to form at least one slot extending entirely through said base member and defining a temporary support portion within said insulative base member;

applying photoimaging material onto said first opposing surface of said base member, including over said temporary support portion and said slot extending through said base member;

exposing and developing selected portions of said photoimaging material to define a pattern within said photoimaging material;

circuitizing said first surface of said base member; and removing additional portions of said base member to thereby remove said temporary support portion and define an opening extending entirely through said base member.

2. The method of claim 1 wherein said preselected portions of said base member are removed using a routing process.

3. The method of claim 2 wherein said removing of said additional portions of said base member is accomplished using a routing process.

4. The method of claim 1 further including the step of metallizing said first opposing surface of said base member prior to said applying of said photoimaging material.

5. The method of claim 1 wherein said circuitizing of said first surface of said base member is accomplished using a plating process.

6. The method of claim 5 wherein said plating process is an additive plating process.

7. The method of claim 1 wherein said exposing and developing said selected portions of said photoimaging material is accomplished using a masking process.

8. The method of claim 1 wherein said photoimaging material is applied onto said first opposing surface of said base member and over said slot in sheetlike form.

9. The method of claim 1 further including the step of applying precious metal material onto selected regions of said circuitized first surface of said base member after said circuitizing step.

10. The method of claim 1 further including securing a heat sinking and/or stiffener member to said base member along said second opposing surface.

11. The method of claim 10 wherein said securing of said heat sinking and/or stiffener member is accomplished using an adhesive.

12. The method of claim 10 further including the step of positioning an integrated circuit member within said opening extending through said base member.

13. The method of claim 12 further including positioning said integrated circuit member on said heat sinking and/or stiffener member.

14. The method of claim 12 further including the step of electrically coupling said integrated circuit member to the circuitry formed as a result of said circuitizing of said first surface of said base member.

15. The method of claim 14 wherein said electrical coupling is accomplished using a wire bonding process.

* * * * *